United States Patent [19]

Zhang

[11] Patent Number: 6,075,205

[45] Date of Patent: Jun. 13, 2000

[54] TUBULAR EXTRUSION GASKET PROFILE EXHIBITING A CONTROLLED DEFLECTION RESPONSE FOR IMPROVED ENVIRONMENTAL SEALING AND EMI SHIELDING

[75] Inventor: Kai Zhang, Reading, Mass.

[73] Assignee: Parker-Hannifin Corporation, Cleveland, Ohio

[21] Appl. No.: 09/044,485

[22] Filed: Mar. 19, 1998

Related U.S. Application Data

[60] Provisional application No. 60/065,938, Oct. 27, 1997.

[51] Int. Cl.$^7$ ................................................ H05K 9/00
[52] U.S. Cl. .................................. 174/35 GC; 277/920
[58] Field of Search ........................... 174/35 GC, 35 R; 277/920; 439/927; 361/816, 818, 800

[56] References Cited

U.S. PATENT DOCUMENTS

| | | | |
|---|---|---|---|
| 3,758,123 | 9/1973 | Ksieski | 277/206 |
| 4,857,668 | 8/1989 | Buonanno | 174/35 GC |
| 4,937,128 | 6/1990 | Quiles | 428/156 |
| 4,968,854 | 11/1990 | Benn, Sr. et al. | 174/35 GC |
| 5,008,485 | 4/1991 | Kitagawa | 174/35 GC |
| 5,028,739 | 7/1991 | Keyser et al. | 174/35 GC |
| 5,068,493 | 11/1991 | Benn, Sr. et al. | 174/35 GC |
| 5,105,056 | 4/1992 | Hoge, Jr. et al. | 174/35 GC |

(List continued on next page.)

FOREIGN PATENT DOCUMENTS

WO 95 02953  1/1995  WIPO .

OTHER PUBLICATIONS

Article entitled "Gaskets That Block EMI", dated Aug., 1975.

Pamphlet entitled "Ultra–Vanshield—Dual Elastomer RFI/EMI Shielding Gaskets" of Vanguard Products Corp., No Date.

Chomerics' Technical Bulletin 13 entitled "CHO–SEAL Aerospace–200 Grade Conductive Silicone" dated 1995.

Chomerics' Technical Bulletin 20 entitled "Commercial Grade Conductive Elastomer Extrusions with Pressure–Sensitive Adhesive Attachment System" dated 1997.

Chomerics' Technical Bulletin 25 entitled CHO–SEAL 3000 Low Closure Force, Conductive Elastomer EMI Gaskets dated 1996.

(List continued on next page.)

*Primary Examiner*—Dean A. Reichard
*Assistant Examiner*—Hung V Ngo
*Attorney, Agent, or Firm*—John A. Molnar, Jr.

[57] ABSTRACT

An EMI shielding and environmental sealing gasket for interposition between a first substrate and an oppositely-disposed second substrate. The gasket is formed of a resilient, tubular body having a generally continuous interior and exterior surface defining a wall thickness of the gasket therebetween, and including base, arcuate, and lateral members. The base member extends intermediate a first and a second edge and has an inner and outer for contact with the second substrate. The arcuate member, which has an inner surface spaced apart radially from the inner surface of the base member and an outer surface for contact with the first substrate, extends intermediate a first proximal end disposed radially inwardly of the first edge of the base member, and a second proximal end disposed radially inwardly of the second edge of the base member. A first lateral member extends from the first edge of the base member to the first proximal end of the arcuate member, with a second lateral member extending from the second edge of the base member to the second proximal end of the arcuate member. Each of the lateral members has an outer surface and an inner surface which defines a acute angle with the inner surface of the base member. The gasket so constructed is deflectable under a predetermined compressive force between the first and second substrates into a collasped orientation characterized in that substantially continuous contact is maintained between the outer surface of the base member and the second substrate.

20 Claims, 10 Drawing Sheets

U.S. PATENT DOCUMENTS

| | | | |
|---|---|---|---|
| 5,107,070 | 4/1992 | Benn, Sr. et al. | 174/35 GC |
| 5,115,104 | 5/1992 | Bunyan | 174/35 GC |
| 5,142,101 | 8/1992 | Matsuzaki et al. | 174/35 GC |
| 5,202,536 | 4/1993 | Buonanno | 174/35 GC |
| 5,512,709 | 4/1996 | Jencks et al. | 174/35 GC |
| 5,522,602 | 6/1996 | Kaplo et al. | 277/53 |
| 5,524,908 | 6/1996 | Reis | 277/233 |
| 5,578,790 | 11/1996 | Peregrim | 174/35 GC |
| 5,603,514 | 2/1997 | Jencks et al. | 277/730 |

OTHER PUBLICATIONS

Chomerics' Technical Bulletin No. 58 entitled "CHO–SEAL 1285 Conductive Elastomer with Improved Corrosion Resistance" dated 1997.

Pp. 42–47 from Chomerics' "EMI Shielding Engineering" Handbook dated 1989/90.

Pp. 39–51 and 65 from Chomerics' "EMI Shielding for Military/Aerospace Electronics" Handbook dated Sep., 1996.

Pp. 10, 14, 15, 17 and 25 from Chomerics' "EMI Shielding for Commercial Electronics" Handbook dated 1996.

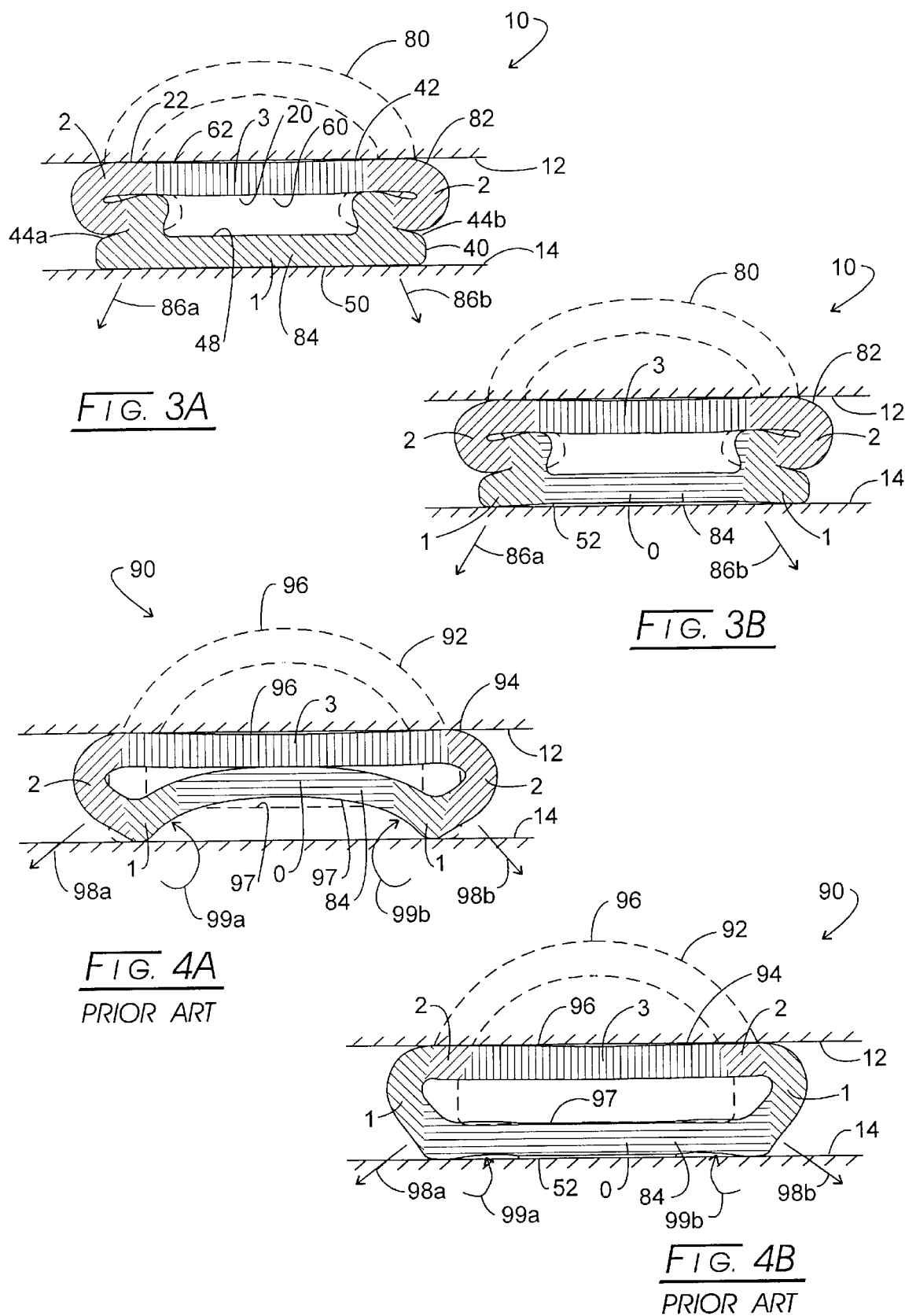

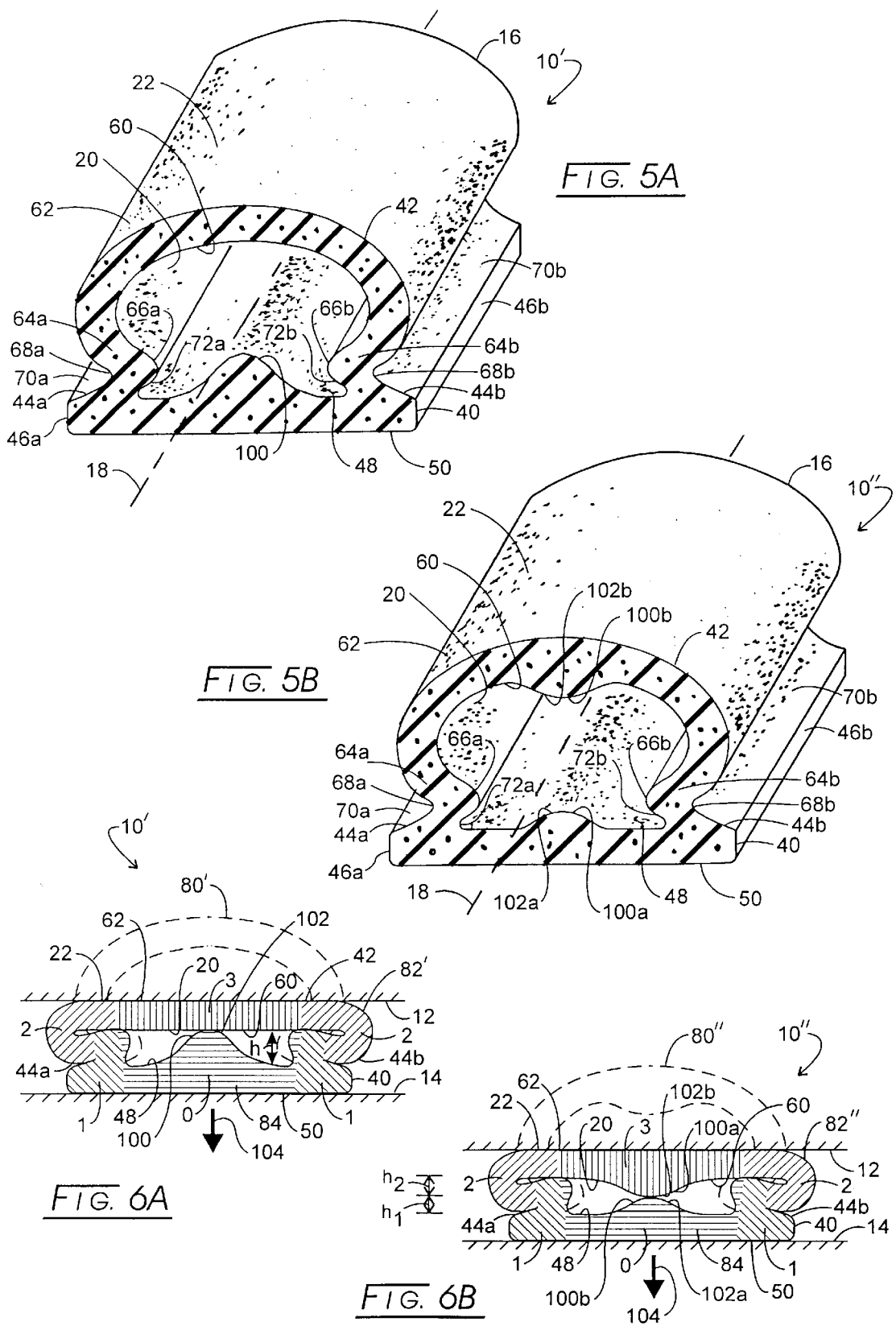

TUBULAR EXTRUSION GASKET PROFILE EXHIBITING A CONTROLLED DEFLECTION RESPONSE FOR IMPROVED ENVIRONMENTAL SEALING AND EMI SHIELDING

RELATED CASES

The present application claims priority to U.S. Provisional Application Ser. No. 60/065,938, filed Oct. 27, 1997.

BACKGROUND OF THE INVENTION

The present invention relates broadly to gaskets for providing environmental sealing and/or electromagnetic interference (EMI) shielding, and more particularly to an electrically-conductive, tubular extrusion gasket profile which exhibits a controlled deflection response when compressibly deformed intermediate a pair of surfaces such as within an electronics enclosure.

The operation of electronic devices including televisions, radios, computers, medical instruments, business machines, communications equipment, and the like is attended by the generation of electromagnetic radiation within the electronic circuitry of the equipment. Such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having a less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

As is shown in U.S. Pat. Nos. 5,603,514; 5,522,602; 5,512,709; 5,438,423; 5,524,908; 5,202,536; 5,142,101; 5,115,104; 5,105,056; 5,028,739; 5,008,485; 4,952,448; and 4,857,668, EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone rubber, or fluorosilicone rubber.

Conductive materials for the filler, sheathing, or coating include metal or metalplated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, plated glass, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression, transfer, or injection molding of an uncured or thermoplastic elastomer into the desired configuration.

Requirements for typical EMI shielding applications, and particularly those for tubular extrusion gasket profiles, generally specify a low impedance, low profile connection which is deflectable under normal closure force loads. Other requirements include low cost and a design which provides an EMI shielding effectiveness for both the proper operation of the device and compliance, in the United States, with commercial Federal Communication Commission (FCC) EMC regulations.

As revealed in U.S. Pat. Nos. 3,758,123, 4,968,854; 5,068,493; 5,107,070; and 5,578,790, Vanguard Products, Danbury, Conn., publication "Ultra-Vanshield," and in the Parker Chomerics, Woburn, Mass., publications: "EMI Shielding For Commercial Electronics" pp. 10, 14, 15, 17, and 25 (1996); EMI Shielding Engineering Handbook," pp. 42–47 (1989); "EMI Shielding for Military/Aerospace Electronics," pp. 39–51, 65 (1996); and Technical Bulletins 13 (1995), 20 (1997), 25 (1996), and 58 (1997), typical design for conventional gasket profiles include round or O-shaped, square, rectangular, inverted D, P, or V-shaped, Ω-shaped, U-shaped, and various combination cross-sections. Heretofore, a D-shaped extrusion profile including a planar base portion and a rounded upper portion often was specified for certain sealing applications as the base portion afforded a generally flat interface surface useful for securing the gasket to an opposing mating surface of substrate with a pressure sensitive adhesive (PSA) or the like. With respect to tubular, i.e., hollow D-shaped extrusion profiles, however, it has been observed that, in a compressed or deformed orientation, these profiles exhibit a deflection response characterized by an upward lifting of a the planar base portion from the mating surface. This deflection, in reducing the contact area between the base portion and mating substrate, will be appreciated to correspondingly decrease both the overall EMI shielding and the environmental sealing effectiveness of the gasket. Moreover, this deflection further exerts a lifting force on any PSA interlayer tape which may ultimately produce an adhesive failure via a shear or peel mechanism.

In view of the foregoing, it will be appreciated that improvements in the design of tubular extrusion profiles for EMI shielding gaskets and the like would be well-received by the electronics and other industries. Especially desired would be an extrudable profile adapted for use even in low closure force application which maintains uniform contact with the base substrate for consistent EMI shielding and environmental sealing performance.

BROAD STATEMENT OF THE INVENTION

The present invention is directed to an extrudable, tubular gasket profile for environmental sealing and/or electromagnetic interference (EMI) shielding which exhibits a controlled deflection response when compressibly deformed intermediate a pair of surfaces such as within an electronics enclosure. As with conventional D-shaped profiles, the gasket of the present invention is of an annular geometry which includes a generally rounded, arcuate upper portion and a generally planar base portion which define generally continuous interior and exterior surfaces. However, the gasket further includes an opposing pair of lateral portions each extending on either side of the gasket intermediate the corresponding edges of the upper and base portions. The lateral portions are angularly disposed in a radially inwardly directed orientation such that the inner surfaces thereof portions each defmes an acute angle with the inner surface of the base member. Through mathematical modeling simulations, the areas defined at the intersections of the arcuate and lateral portions have been observed to function as stress relaxation zones within which the gasket is collapsible for a controlled deformation response obviating the uplifting of the gasket base portion from the substrate. When employed, for example, in electronics applications, the gasket of the invention advantageously provides consistent EMI shielding and, additionally, environmental sealing effectiveness.

In a preferred embodiment for EMI shielding applications, the tubular gasket profile of the invention is extruded from an elastomeric material, such as a silicone or fluorosilicone rubber, and is rendered electrically-conductive either by its loading with a silver or nickel-based filler, or by its jacketing within a coated or co-extruded outer layer of a silicone or fluorosilicone material which is loaded with a silver or nickel-based filler. Although a uniform wall thickness may be maintained for ease of processing, the gasket profile of the invention alternatively contemplates the provision of a non-uniform wall thickness to define one or more centrally-disposed, longitudinal bearing portions extending radially inwardly from one or both of the inner surfaces of the gasket base and arcuate portions. In the compressed orientation of the gasket, these bearing portions advantageously develop an abutting, force-transmitting contact between the arcuate and base portions effective to further maintain the base portion in uniform contact with the mating substrate surface.

One disclosed embodiment of the present invention therefore involves an EMI shielding and/or environmental sealing gasket for interposition between a first substrate surface and an oppositely-disposed second substrate surface. The gasket is formed of a resilient, tubular body of indefinite length which extends axially along a central longitudinal axis. The tubular body has a generally continuous interior and exterior surface defining a wall thickness of the gasket therebetween, and includes a planar base member, an arcuate member, and a pair of lateral members. The base member, which extends intermediate a first and a second edge, has an inner surface forming a portion of the interior surface of the body, and an outer surface forming a portion of the exterior surface of the body for contact with the second substrate surface. The arcuate member has an inner surface spaced apart radially from the inner surface of the base member and forming another portion of the interior surface of the body, and an outer surface forming another portion of the exterior surface of the body for contact with the first substrate surface. The arcuate member further extends radially outwardly of the longitudinal axis along a predetermined locus intermediate a first proximal end disposed radially inwardly of the first edge of the base member, and a second proximal end disposed radially inwardly of the second edge of the base member. A first lateral member extends from the first edge of the base member to the first proximal end of the arcuate member, with a second lateral member extending from the second edge of the base member to the second proximal end of the arcuate member. Each of the lateral members has an outer surface forming an additional portion of the exterior surface of the tubular body, and an inner surface forming an additional portion of the interior surface of the tubular body and defining a acute angle with the inner surface of the base member. The gasket so constructed is deflectable under a predetermined compressive force between the first and second substrate surface into a collapsed orientation characterized in that substantially continuous contact is maintained between the outer surface of the base member and the second substrate surface.

In another disclosed embodiment, the invention involves an EMI shielding and/or environmental sealing gasket which is deflectable into a collasped orientation under a predetermined compressive force between a first substrate surface and an oppositely-disposed second substrate surface. The gasket is formed of a resilient, tubular body of indefinite length which extends axially along a central longitudinal axis. The tubular body has a generally continuous interior and exterior surface defining a wall thickness of the gasket therebetween, and includes a planar base member and an arcuate member. The base member, which extends intermediate a first and a second edge, has an inner surface forming a portion of the interior surface of the body, and an outer surface forming a portion of the exterior surface of the body for contact with the second substrate surface. The arcuate member has an inner surface spaced apart radially from the inner surface of the base member and forming another portion of the interior surface of the body, and an outer surface forming another portion of the exterior surface of the body for contact with the first substrate surface. The arcuate member further extends radially outwardly of the longitudinal axis along a predetermined locus intermediate a first proximal end disposed adjacent the first edge of the base member, and a second proximal end disposed adjacent the second edge of the base member. One or both of the inner surfaces of the arcuate and base members are configured as having have an area of enlarged wall thickness defining an elongate bearing member. Each bearing member extends axially generally parallel to the longitudinal axis along at least a portion of the length of the gasket, and radially inwardly from a corresponding one of the inner surfaces to a distal end. In the collapsed orientation of the gasket, the distal end of each bearing member is disposable in an abutting, force transferring relationship with the opposing one of the inner surfaces urging the base member into contact with the second substrate.

Advantages of the preferred embodiments of the present invention include an improved extrusion gasket profile for low closure force applications such as may be found in electronic devices. Additional advantages are a gasket profile which provides a large but controlled deflection and uniform interface contact with the base substrate for more assured electrical and physical continuity and, in turn, more reliable EMI shielding and environmental sealing effectiveness. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein:

FIG. 3A is a graphical representation of a finite element model showing, in cross-section, predicted stress distributions in the collapsed configuration of the gasket profile of FIG. 1 as compressed between a mating pair of substrate surfaces;

FIG. 3B is a graphical representation as in FIG. 3A but with the base portion of the gasket being bonded to the facing substrate surface via an adhesive interlayer;

FIG. 4A is a graphical representation as in FIG. 3A for a D-shaped gasket profile representative of the prior art;

FIG. 4B is a graphical representation as in FIG. 3A for the D-shaped gasket profile of FIG. 4A but with the gasket base being bonded to the facing substrate surface via an adhesive interlayer;

FIG. 5A is a perspective end view of another embodiment of an EMI shielding gasket profile configured in accordance with the present invention as including an elongate bearing portion extending radially inwardly from the inner surface of the lower base member;

FIG. 5B is a perspective view of an alternative embodiment of the gasket of FIG. 5B as including a second elongate bearing member extending radially inwardly from the inner surface of the upper arcuate member;

FIG. 6A is a graphical representation of a finite element model showing, in cross-section, predicted stress distributions in the collapsed configuration of the gasket profile of FIG. 5A as compressed between a mating pair of substrate surfaces;

FIG. 6B is a graphical representation as in FIG. 6A for the gasket profile of FIG. 5B;

Figure 1:
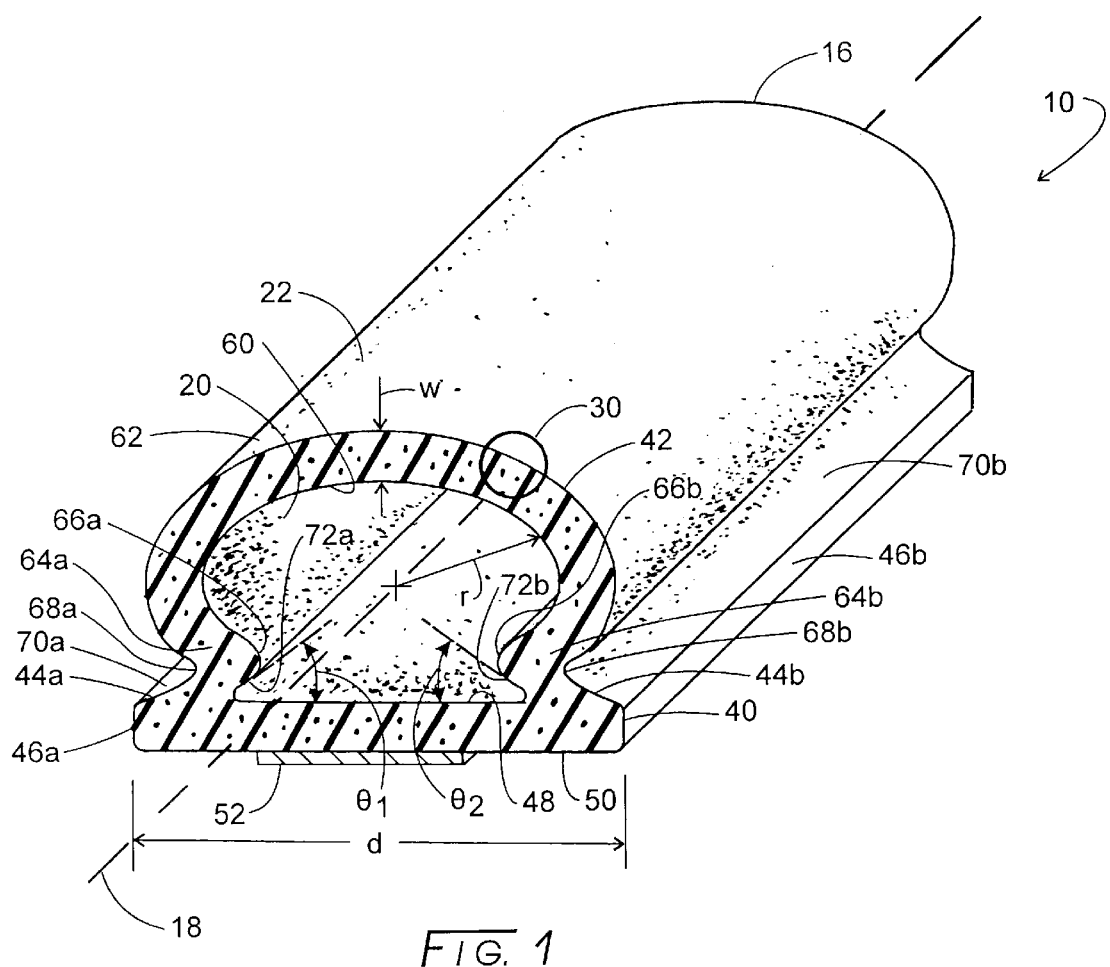
FIG. 1 is a perspective end view of one embodiment of an EMI shielding gasket profile configured in accordance with the present invention as including a lower base member, an upper arcuate member, and a pair of acutely-angled lateral members.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

For the illustrative purposes of the discourse to follow, the gasket profile herein involved is described as adapted to be received within an interface, such as between a door, panel, hatch, cover, or other parting line of an electromagnetic interference (EMI) shielding structure. The EMI shielding structure may be the conductive housing of a computer, cellular phone, or other electronic device or equipment which generates EMI radiation or is susceptible to the effects thereof. The gasket may be bonded or fastened to, or press-fit into one of a pair of mating surfaces which define the interface within the housing, and functions between the mating surfaces to seal any interface gaps or other irregularities. That is, while under an applied pressure, the gasket resiliently conforms to any such irregularities both to establish a continuous conductive path across the interface, and to environmentally seal the interior of the housing against the ingress of dust, moisture, or other contaminates. It will be appreciated, however, that aspects of the present invention may find utility in other sealing applications. Use within those such other applications therefore should be considered to be expressly within the scope of the present invention.

Referring then to the figures, wherein corresponding reference characters are used to designate corresponding elements throughout the several views with equivalent elements being referenced with prime designations, an electromagnetic interference (EMI) shielding gasket according to the present invention is shown generally at 10 as generally adapted for interposition between a mating pair of a first and a second substrate surface, referenced at 12 and 14 in FIGS. 3A and 3B, such as may be found within an electronics enclosure. For purposes of illustration, gasket 10 is shown to be of an indefinite length which may cut, sectioned, or otherwise terminated for sizing to the periphery of the interface to be sealed.

In basic construction, gasket 10 may be seen to include a unitary tubular or annular body, 16, which extends axially along a central longitudinal axis, 18. Body 16, which is of a closed, generally Ω-shaped cross-sectional geometry, has a continuous interior surface, 20, and exterior surface, 22, which define a wall thickness, referenced at "w" therebetween. For ease of manufacturing, wall thickness w may be generally uniform and, for most applications, typically will be between about 0.25–0.60 inch (1.125–1.5 mm), but as may depend upon, for example, the gasket diameter. Body 16 may be of any diametric extent, referenced at "d," but for most applications will have a diameter or width of from about 0.25 inch (0.64 cm) to 1 inch (2.54 cm).

Preferably, tubular body 16 is formed of an elastomeric or other resilient polymeric or plastic material selected as being compliant over a wide range of temperatures, and as exhibiting good compression-relaxation characteristics even after repeated cyclings or long compression dwells. Suitable elastomeric materials, which may be open or closed cell foams or unfoamed, include thermoplastic or thermosetting synthetic rubbers such as SBR, polybutadiene, EPDM, butyl, polyurethane, neoprene, nitrile, polyisoprene, silicone, fluorosilicone, buna-N, copolymer rubbers, and blends such as ethylene-propylene and polypropylene-EPDM, as well as other plastic or polymeric materials such as polyethylene, polypropylene, and EVA. As used herein, the term "elastomeric" is ascribed its conventional meaning of exhibiting rubber-like properties of compliancy, resiliency or compression deflection, low compression set, flexibility, and an ability to recover after deformation, i.e., stress relaxation.

For economical manufacture and performance considerations, tubular body 16 preferably is profile extruded of an electrically-conductive, elastomeric silicone or fluorosilicone binder component which is rendered electrically conductive throughout its cross-section via its loading with an electrically-conductive filler component. As with silicones in general, the silicone binder component exhibits such physical properties as thermal and oxidation resistance over a wide temperature range, and well as resistance to many chemicals and to weather effects. The material further exhibits excellent electrical properties, including resistance to corona breakdown, over a wide range of ambient temperatures and humidity.

Suitable electrically-conductive fillers include nickel and nickel-plated substrates such as nickel-graphite, noble metal-based fillers, and particularly silver-based fillers such as: pure silver; silver-plated noble metals such as silver-plated gold; silver-plated non-noble metals such as silver-plated copper, nickel, aluminum, and tin; and silver-plated glass, ceramics, plastics, and mica; and mixtures thereof. The shape of the filler is not considered critical to the present invention, and may include any shape that is conventionally involved in the manufacture or formulation of conductive materials of the type herein involved including solid spheres, hollow microspheres, flakes, platelets, fibers, rods, or irregularly-shaped particles. Similarly, the particle size of the filler is not considered critical, but generally will be in the range of from about 0.250–250 μm, with a range of from about 0.250–75 μm being preferred.

The filler is loaded in the composition in a proportion sufficient to provide the level of electrical conductivity and EMI shielding effectiveness in the cured gasket which is desired for the intended application. For most applications, an EMI shielding effectiveness of at least 10 dB, and preferably at least 20 dB, and most preferably at least 100 dB or higher, over a frequency range of from about 10 MHz to 12 GHz is considered acceptable. Such effectiveness translates to a filler proportion which generally is between about 10–80% by volume, based on the total volume of the reaction system, and preferably is between about 20–70% by volume. As is known, however, the ultimate shielding effectiveness of the cured gasket will vary based on the amount of electrically-conductive material in the filler and the imposed load or deflection, typically between about 10–50%, of the gasket.

Particularly preferred materials for tubular body 16 are silver-copper, silver-glass, silver-aluminum, and nickel-graphite filled silicone and fluorosilicone formulations which are marketed by the Chomerics Division of Parker-Hannifin Corp., Woburn, Mass. under the tradenames Cho-Seal® 100, 1200, 1300, and 6000 Series, and Co-Sil® 1400 Series. These materials generally have a low volume resistivites and good resistance to compression set over a wide temperature range making them well-suited for grounding applications in which a flexible electrical contact is needed.

Figures 2A, 2B:
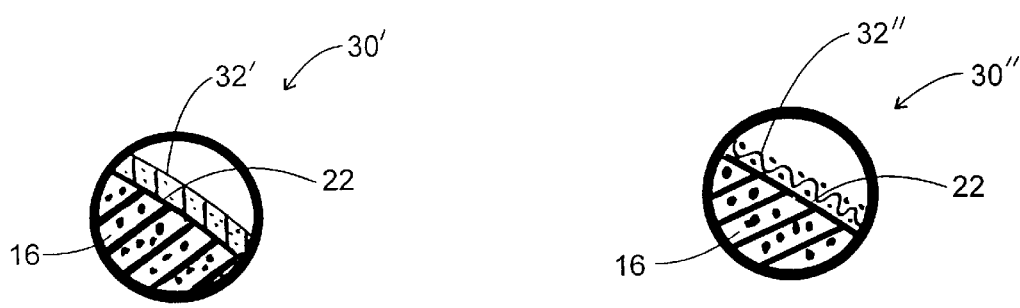
FIG. 2A is a magnified end view of an alternative construction of the gasket of FIG. 1 including an electrically conductive coating or other outer layer.
FIG. 2B is a magnified end view of another alternative construction of the gasket of FIG. 1 including an electrically conductive mesh outer layer or sheathing.

In another embodiment illustrated in FIG. 2A, wherein an enlarged view of the detail of gasket 10 referenced at 30 in FIG. 1 is shown at 30', the electrically conductive filler alternatively is provided within a relatively thin, i.e., 1–10 mil thick, outer layer, 32', which may be coated, co-extruded, or otherwise disposed on at least a portion of the exterior surface 22 of gasket 10. As is known in the art, outer layer 32' may be formulated as a silicone, fluorosilicone, or other elastomeric binder which forms a continuous phase within which the binder is dispersed.

In yet another alternative embodiment illustrated in FIG. 2B, wherein an enlarged view of the detail 30 is shown at 30", gasket 10 alternatively is rendered electrically conductive via the provision of an electrically conductive fiber mesh outer layer, 32". Again as is known in the art, fiber mesh outer layer 32" may be wound, knitted or woven over the exterior surface 22 of a pre-formed body 16 from a single-stranded, electrically-conductive fiber or wire having a thickness of from about 2–10 mils, or, alternatively, a multi-stranded wire or yarn having a thickness of 2–10 mils or denier of from about 50–1200. Suitable metal wires include copper, nickel, silver, aluminum, tin or alloys such as Monel, with other suitable fibers including carbon, graphite, and conductive polymers. Alternatively, nonconductive fibers and yarns, such as cotton, wool, silk, cellulose, polyester, polyamide, nylon, polyamide, or the like, may be coated with a conductive material such as a metal, carbon, or the like. Particularly preferred fibers include silver-coated nylon yarn, e.g., 108 denier multi-fill nylon yarn having 20% by weight of silver plated thereon (Sauquoit Industries, Inc., Scranton, Pa.), and wires such as Monel, silver-plated copper, nickel-clad copper, Ferrex®, aluminum, tin-clad copper, and phosphor bronze. Moreover, depending upon the needs of the specific application for gasket 10, a blend of conductive and nonconductive fibers may be used.

Returning to FIG. 1, resilient, tubular body 16 of gasket 10 further may be seen to include a generally planar base member, 40, a generally arcuate member, 42, and a pair of lateral members, 44a–b. Base member 40, which extends radially intermediate a first and second edge, 46a–b, has an inner surface, 48, which forms a first portion of the interior surface 20 of body 16, and an outer surface, 50, which forms a first portion of the exterior surface 22 of body 16. Base member outer surface 50 is disposable in contact with the second substrate surface 14 (FIG. 3), and may be bonded thereto with an adhesive interlayer, 52. For ease of use, it is preferred that adhesive interlayer 52 is of a pressure sensitive variety, and is applied substantially continuously along the longitudinal extent of outer surface 50 intermediate the edges 46 of base member 40. Alternatively, interlayer 52 may be applied to surface 50 in a discontinuous pattern.

As aforementioned, interlayer 52 preferably is formulated as a pressure sensitive adhesive (PSA). By "PSA" it is meant that the adhesive is provided as having a sufficiently low glass transition temperature to be tacky at about room temperature, and as being adherable to the substrate with only a nominal applied pressure. Adhesives of such type generally are preferred for purposes of the present invention as typically requiring no additional curing steps. Moreover, such adhesives may be applied to outer surface 50 in the form of a doubled sided tape, one side of which is applied to surface 50 in an automated fashion from a dispensing head using a continuous feed and nip roll pressure or the like for consolidation.

As is described in U.S. Pat. No. 4,988,550, suitable PSA's for EMI shielding applications include formulations based on silicones, neoprene, styrene butadiene copolymers, acrylics, acrylates, polyvinyl ethers, polyvinyl acetate copolymers, polyisobutylenes, and mixtures, blends, and copolymers thereof. Acrylic-based formulations, however, generally are considered to be preferred for the EMI applications of the type herein involved. Although PSA's are preferred for adhesive layer 52, other adhesives such as epoxies and urethanes may be substituted and, accordingly, are to be considered within the scope of the present invention. Heat-fusible adhesives such a hot-melts and thermoplastic films additionally may find applicability.

Inasmuch as the bulk conductivity of gasket 10 is determined substantially through its surface contact with the substrate, an electrically-conductive PSA alternatively may be utilized to ensure optimal EMI shielding performance. Such adhesives conventionally are formulated as containing about 1–25% by weight of a conductive filler to yield a volume resistivity of from about 0.01–0.001 Ω-cm. The filler may be incorporated in the form of particles, fibers, flakes, microspheres, or microballoons, and may range in size of from about 1–100 microns. Typically filler materials include inherently conductive material such as metals, carbon, and graphite, or nonconductive materials such as plastic or glass having a plating of a conductive material such as a noble metal or the like. In this regard, the means by which the adhesive is rendered electrically conductive is not considered to be a critical aspect of the present invention, such that any means achieving the desired conductivity and adhesion are to be considered suitable.

For protecting the adhesive interlayer layer 52 during handling, a conventional release sheet (not shown) may be supplied as removably attached to the exposed adhesive surface. As is common in the adhesive art, the release sheet may be a strip of a waxed, siliconized, or other coated paper or plastic sheet or the like having a relatively low surface energy so as to be removable without appreciable lifting of the adhesive from the base member outer surface 50. Prior to use, the sheet therefore may be easily removed to expose the tacky adhesive surface.

Arcuate member 42 likewise is defined as having an inner surface, 60, and an outer surface, 62. Inner surface 60 is spaced-apart radially from the inner surface 48 of base member 40 and forms a second portion of the interior surface 20 of body 16. Outer surface 62, in turn, is disposable for abutting contact with the first substrate surface 12 (FIG. 3). Arcuate member 42 further is defined as extending radially outwardly a fixed or variable distance, reference at "r," from central axis 18, along a predetermined locus intermediate a first proximal end, 64a, disposed radially inwardly of base member first edge 46a, and a second proximal end, 64b, disposed radially inwardly of base member second edge 46b. Although arcuate member 42 is shown in FIG. 1 as extending along a generally elliptical locus, other arcuate geometries, such as circular, are to be considered within the scope of the invention herein involved.

In accordance with the precepts of the present invention, lateral members 44 each are provided extending intermediate an associated one of the edges 46 of base member 40 and the corresponding proximal end 64 of arcuate member 42. In this regard, first lateral member 44a extends from first edge 46a to intersect first proximal end 64a in defining first inner and outer radiused portions, 66a and 68a, respectively, of body 16, with second lateral member 44a, in turn, extending from second edge 46b to intersect second proximal end 64b in defining second inner and outer radiused portions, 66b and 68b, respectively, of body 16. First and second lateral members 44 each further are provided as having an outer surface, 70a–b, which defines, respectively, third and fourth portions of the exterior surface 22 of body 16, and an inner surface, 72a–b, which defines, respectively, third and fourth portions of the interior surface 20 of body 16. Each of the inner surfaces 72 further defines an acute angle, $\theta_1$ and $\theta_2$, with the inner surface 48 of base member 40. Acute angles $\theta_1$ and $\theta_2$ preferably are between about 15° and 60°, and, as is shown, substantially equal.

By virtue of the provision of lateral members 44, gasket 10 of the invention is thereby made to exhibit a controlled deflection response. Such response is graphically illustrated in FIGS. 3A–B wherein a finite element model of gasket 10 of the invention is shown at 80 in an uncompressed or normal orientation, and as superimposed at 82 in a collapsed orientation as compressed between the substrate surfaces 12 and 14 under a predetermined compressive force which, for typical gasket sizes and wall thicknesses, may average about 10 $lb_f$ per inch of gasket length at 50%. The deflection response of gasket 10 is modeled both with, FIG. 3B, and without, FIG. 3A, the use of adhesive interlayer 52 bonding base member outer surface 50 to second substrate surface 14. The strain elements used in the modeling are represented by the grid lines commonly referenced at 84, with the contours designated 0–3 representing, respectively, regions of varying levels of stress.

Looking initially to FIG. 3A, it may be observed that in the collapsed orientation 82 of gasket 10, arcuate member 42 is supported on lateral members 44 in an abutting, force transferring relationship therewith. That is, with stress relaxation zones being defined at the intersections of the arcuate and lateral members, gasket 10 is preferentially collapsed within those zones for a controlled deformation response. Such response advantageously develops a reaction force, represented by arrows 86a–b, having a significant downwardly-directed vertical component for urging the outer surface 50 of base member 40 into contact with the second substrate surface 14. In this way, substantially continuous contact may be maintained therebetween. Moreover, and as is shown in FIG. 3B, when gasket 10 is utilized in connection with an adhesive interlayer such as layer 52, shear or peel forces are minimized for consistent adhesive performance.

For purposes of comparison, reference next may be had to FIGS. 4A and 4B wherein a finite element model of a conventional, tubular D-shaped gasket profile, 90, is shown at 92 in an uncompressed or normal orientation, and as superimposed at 94 in a collapsed orientation as compressed between the substrate surfaces 12 and 14. As for gasket 10 of the present invention, the deflection response of gasket 90 of the prior art is modeled both with, FIG. 4B, and without, FIG. 4A, the use of an adhesive interlayer 52. Again, the strain elements used in the modeling are represented by the grid lines commonly referenced at 84, with the contours designated 0–3 representing, respectively, regions of increasing stress.

With reference initially to FIG. 4A, D-shaped gasket 90 may be seen in its uncompressed orientation 92 to include a rounded upper portion, 96, disposed opposite first substrate surface 12, and a planar lower portion, 97, which is received on second substrate surface 14. It the collapsed orientation 94, however, upper portion 96 is expanded radially outwardly in developing reaction force 98a–b which, as compared to reaction force 86 of gasket 10 (FIGS. 3A and 3B) is more horizontally directed. Reaction force 98, in turn, induces a bending moment, referenced at 99a–b, about each end of the gasket lower portion 97 which is manifested in an upward, concave deflection thereof. Such deflection, in reducing the contact area between the lower portion 97 and mating substrate surface 14, will be appreciated to correspondingly decrease both the overall EMI shielding and the environmental sealing effectiveness of gasket 90. Moreover, and as may be seen in FIG. 4B, this deflection further exerts a lifting or peel force on the adhesive interlayer 52 which may ultimately produce an cohesive failure via a shear or peel mechanism.

Advantageously, then, the geometry of gasket 10 of the present invention minimizes the bending moment about the ends of the base member 40. Without being bound by theory, it is hypothesized that, while in compression, the inwardly-angled lateral members 44 of the gasket 10 causes a vertical shift in the developed reaction force 86. Such shift directs the line of action of the force 86 to intersect the area where the gasket base portion 40 is supported on substrate surface 14 such that substantially continuous contact may be maintained therebetween.

Turning next to FIGS. 5A and 5B, an alternative embodiment of gasket 10 of the present invention is shown generally at 10' in FIG. 5A and at 10" in FIG. 5B wherein one (FIG. 5A) or both (FIG. 5B) of the inner surfaces 60 and 62 of, respectively, base member 40 and arcuate member 42 are configured as having an area of increased wall thickness defining an elongate bearing member, 100. As may be seen in FIG. 5A, bearing member 100 defines a portion of the inner surface 48 of base member 40 in extending internally within gasket 10' generally parallel to longitudinal axis 18 thereof. In the illustrated embodiment of FIG. 5A, bearing member 100 is provided to extend continuously along the entire lengthwise extent of gasket 10', but alternatively may be interrupted to extend along the lengthwise extent of the gasket in series of discrete steps. Further in the illustrated embodiment of FIG. 5A, bearing member 100 is centrally disposed equidistant edges 46a, 46b of base member 40.

Looking next to FIG. 5B, the inner surface 60 of arcuate member 42 likewise may be configured to define a second elongate bearing member, 100b, which, in the illustrated embodiment, depends internally from arcuate member 42 as disposed opposite a first elongate bearing member, referenced at 100a, extending from the inner surface 48 of base member 40. Again, and as shown, bearing member 100b preferably extends continuously along the entire lengthwise extent of gasket 10", and is centrally disposed equidistant proximal ends 64 of arcuate member 42. Each of the bearing members 100 shown in FIGS. 5A and 5B extends radially inwardly from the corresponding inner surface to a terminal distal end, 102.

In the collapsed orientations 80' and 80" of gaskets 10' and 10", the distal end 102 of each bearing member 100 is disposable in an abutting, force transferring relationship with the opposing inner surface 48 or 60 or, alternatively, the other bearing member 100. Such relationship may be better appreciated with reference to FIGS. 6A–B wherein the respective deflection responses of gaskets 10' and 10" are modeled at 82' and 82" as superimposed over the normal gasket orientations shown in phantom at 80' and 80". As before, the strain elements used in the modeling are represented by the grid lines commonly referenced at 84, with the contours designated 0–3 representing, respectively, regions of increasing stress.

Looking initially to FIG. 6A, it may be observed that in the collapsed orientation 82' of gasket 10', arcuate member 42 is supported on bearing member 100 in an abutting, force transferring relationship therewith. That is, with local areas of maximum stress distribution being developed at the intersections of the arcuate and lateral members, stress relaxation zones again are thereby defined within which gasket 10' is preferentially collapsed for a controlled deformation response. However, with bearing member 100 being provided to extend from base member inner surface 48 to a height, referenced at "h," corresponding to the collapsed height of arcuate member 42, the inner surface 60 of arcuate member 42 may be supported on the distal end 102 of bearing member 100. Such a response advantageously develops a generally downward-directed, central reaction force, designated by arrow 104, urging the outer surface 50 of base member 40 into substantially continuous contact with the second substrate surface 14. Of course, bearing member 100 alternatively may be provided to depend from the inner surface 60 of arcuate member 42.

Continuing with FIG. 6B, it further may be observed that in the collapsed orientation 82" of gasket 10", arcuate member 42 is supported via bearing member 102b on bearing member 100a in an abutting, force transferring relationship therewith. In this regard, bearing member 100a is provided to extend from base member inner surface 48 to a first height, referenced at "$h_1$," with bearing member 100b being provided to extend from arcuate member inner surface 60 to a second height, referenced at "$h_2$," such that the sum of heights $h_1$ and $h_2$ corresponds to the collapsed height of arcuate member 42. Again, such deformation response advantageously develops a generally downward-directed, central reaction force 104 urging the outer surface 50 of base member 40 into substantially continuous contact with the second substrate surface 14.

The Example to follow is illustrative of the practicing and unique features of the invention herein involved, but should not be construed in any limiting sense.

EXAMPLE

Figure 7:
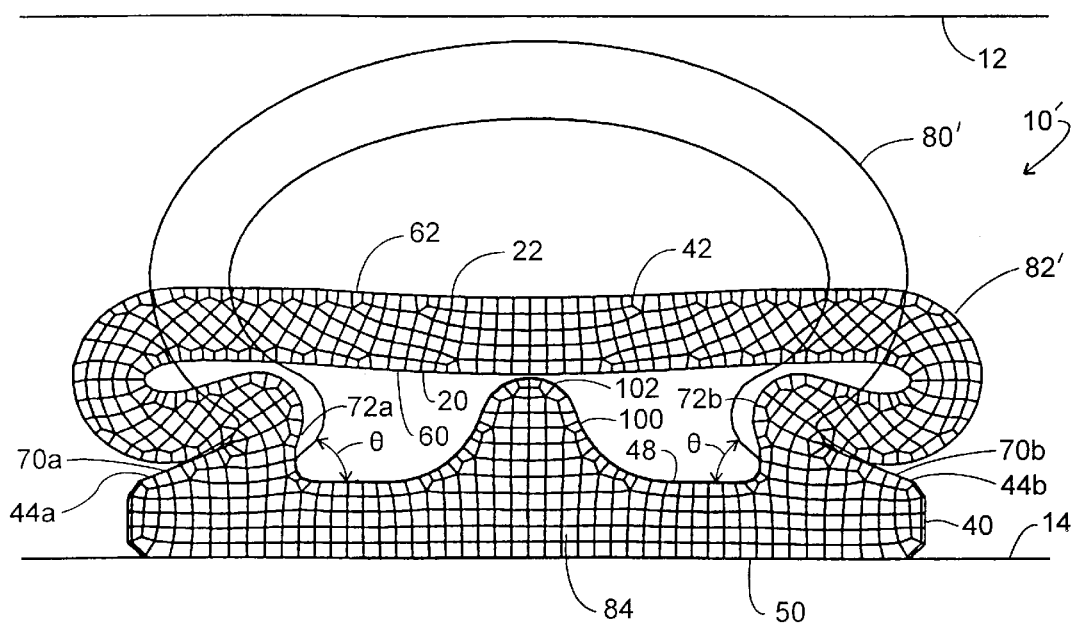
FIG. 7 is a comparative graphical representation of a finite element model showing, in cross-section, the predicted collapsed configuration of a representative gasket profile according to the present invention.
Figure 8:
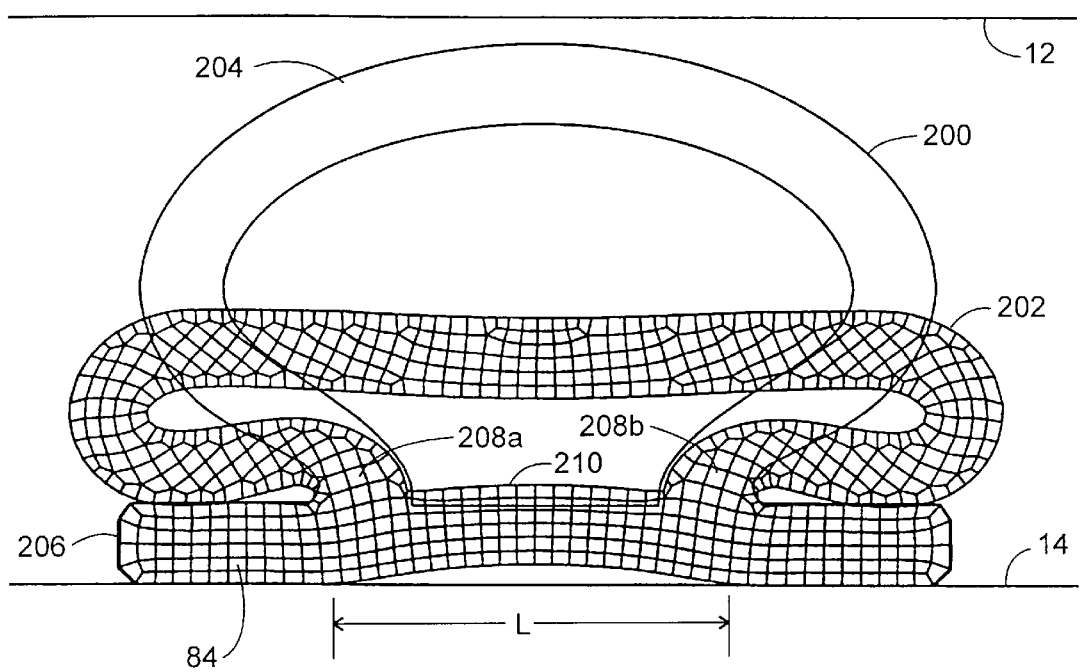
FIG. 8 is a comparative graphical representation as in FIG. 7 for an Ω-shaped gasket profile representative of the prior art.
Figure 9:
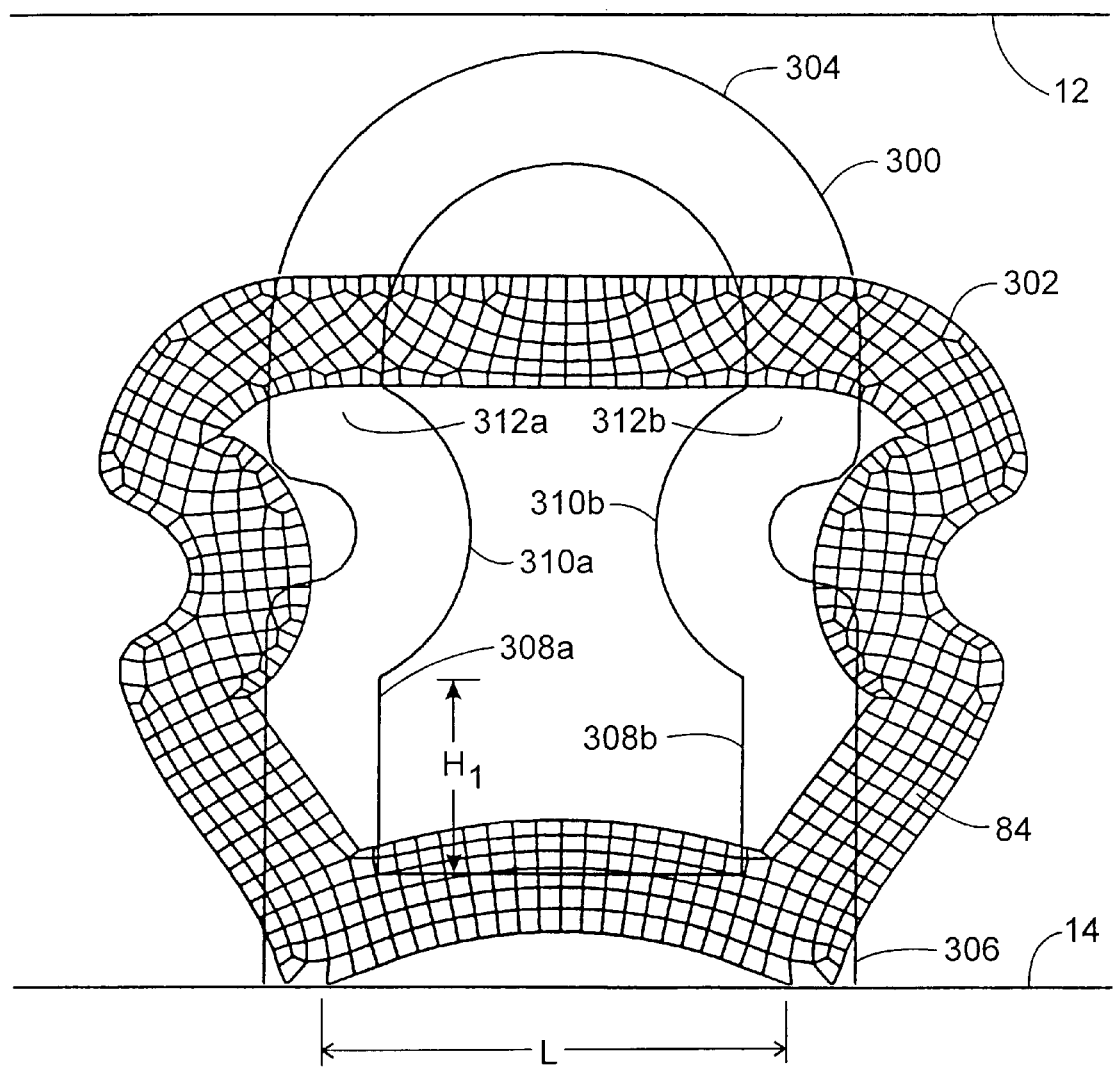
FIG. 9 is a comparative graphical representation as in FIG. 7 for another Ω-shaped gasket profile representative of the prior art.

To confirm the precepts of the present invention, the static load-deflection responses of an extrusion gasket profile configured in accordance with the invention and of conventional Ω-shaped cross-sections representative of the prior art were predicted for purposes of comparison using a nonlinear finite element modeling program, MARC K6 (MARC Analysis Research Corp., Palo Alto, Calif.). In this regard, the uncompressed orientation of gasket 10' of the present invention is depicted in phantom in FIG. 7 at 80', with the uncompressed orientation of prior art Ω-shaped profiles being depicted in phantom, respectively, at 200 and 300 in FIGS. 8 and 9. The collasped orientation of gasket 10' is superimposed at 82' in FIG. 7, with the collapsed orientations of gaskets 200 and 300 of the prior art being superimposed, respectively, at 202 and 302 in FIGS. 8 and 9. Further with respect to gasket profile 300 of the prior art, such profile reappears at 300' in FIG. 9A and at 300" in FIG. 9B as modified in accordance with the teachings of the present invention.

Figure 9A:
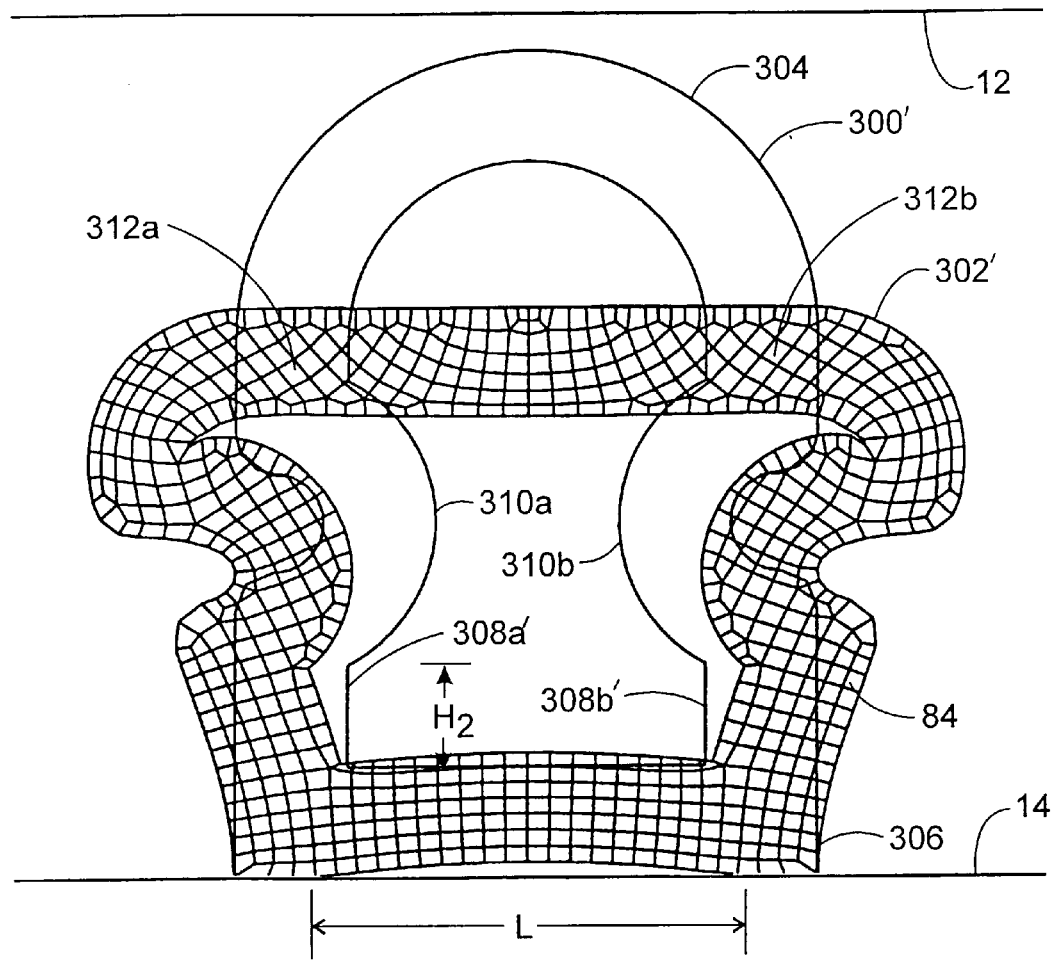
FIG. 9A is a comparative graphical representation as in FIG. 7 of the gasket of FIG. 9 as modified in accordance with the precepts of the present invention.
Figure 9B:
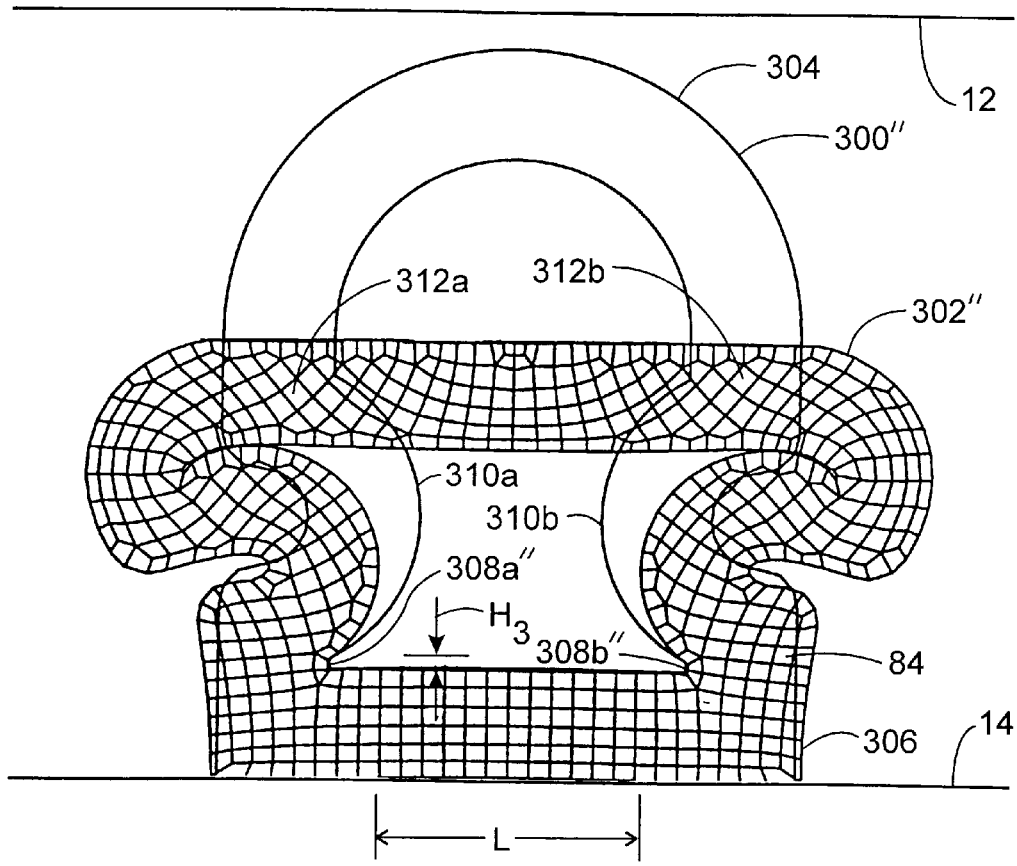
FIG. 9B is a comparative graphical representation as in FIG. 7 of the gasket of FIG. 9A as further modified in accordance with the precepts of the present invention.
Figure 10:
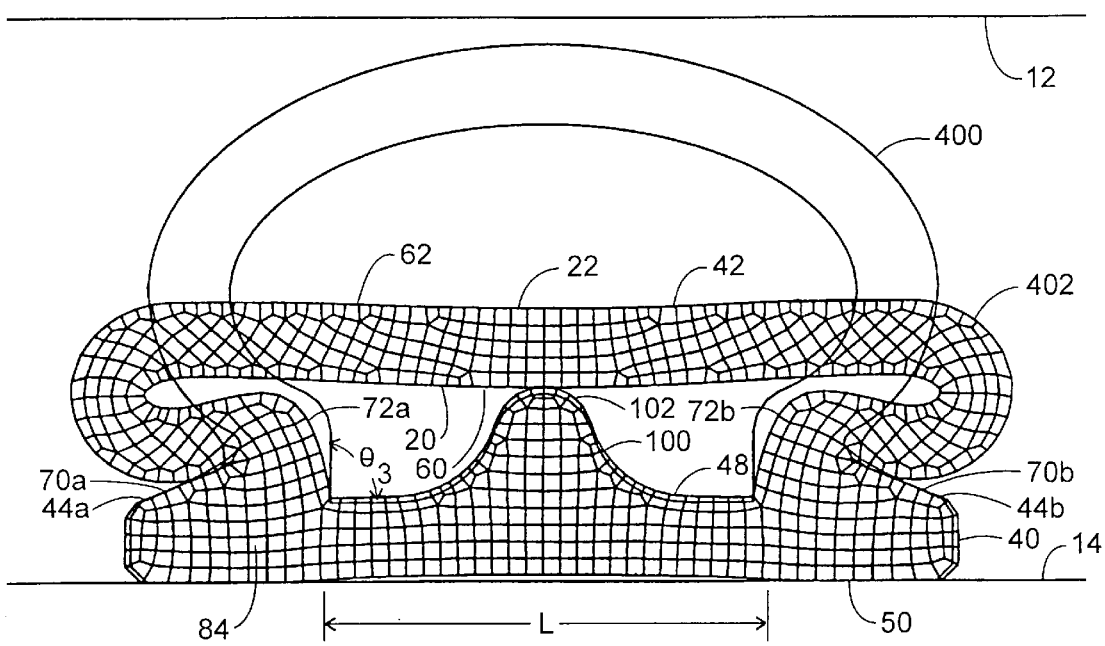
FIG. 10 is a comparative graphical representation as in FIG. 7 illustrative of a first boundary limit of the gasket profile present invention wherein the lateral surfaces are disposed at right angles to the base member.
Figure 11:
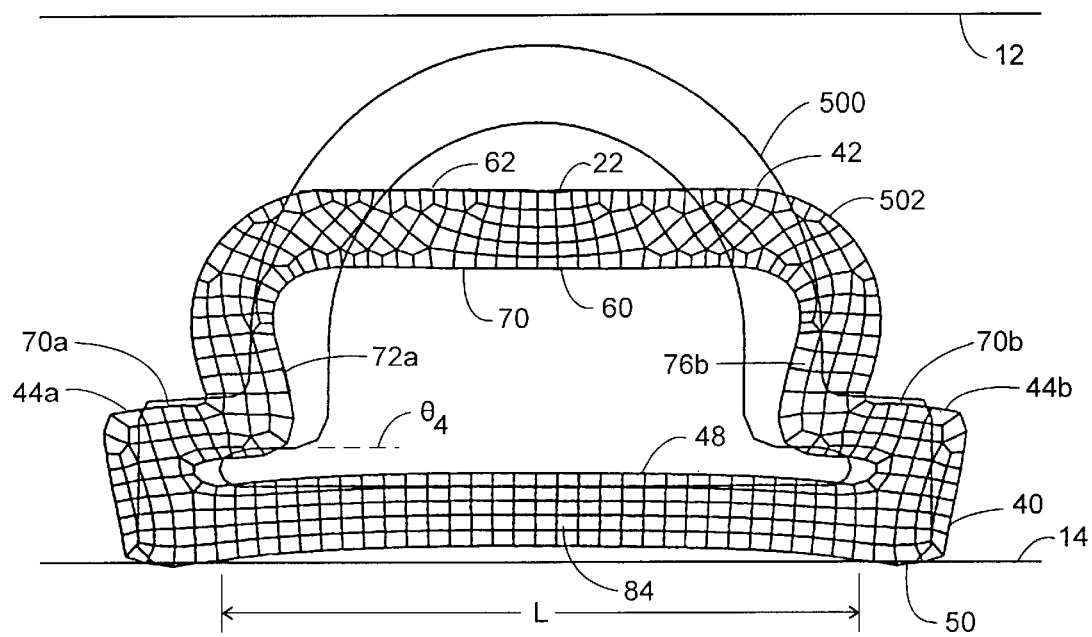
FIG. 11 is a comparative graphical representation as in FIG. 7 illustrative of a second boundary limit of the gasket profile present invention wherein the lateral surfaces are disposed parallel to the base member.

Presented additionally in FIGS. 10 and 11 are variations of gasket 10 of the present invention wherein the inner surfaces 72 of lateral members 44 define an angle θ with the inner surface 48 of base member 40 of 90° (FIG. 12) and 0° (FIG. 13). Similarly in FIGS. 12 and 13, the uncompressed orientations of the gaskets are shown in phantom, respectively, at 400 and 500, with the collapsed orientations thereof being superimposed, respectively, at 402 and 502. In each of FIGS. 7–13, four-node plane strain Hermann elements were used in the modeling and, as in FIGS. 3, 4, and 6, are commonly referenced at 84. Regarding the geometry of the representative prior art profiles, profile 200 of FIG. 8, which includes an upper rounded portion, 204, and a lower, generally planar base portion, 206, lacks, inter alia, the lateral members 44 of the present invention. That is, the proximal ends 208a–b of rounded portion 204 extend directly from the inner surface 210 of base portion 206. With respect to profiles 300, 300', and 300" of FIGS. 9, 9A, and 9B, each of those profiles likewise includes an upper rounded portion, 304, and a lower, generally planar base portion, 306. Profiles 300, 300', and 300" additionally include, however, a spaced-apart pair of intermediate portions, 308a–b, 308a–b', 308a–b", which extend perpendicularly from either edge of the base portion to a decreasing fixed height, H$_1$, H$_2$, H$_3$. Profiles 300, 300', and 300" further include a pair of radiused portions, 310a–b, each disposed intermediate a corresponding one of the intermediate portions 308, 308' and 308", and a proximal end, 312a–b, of the rounded portion 304.

Comparing the bending mechanism responses of profile 10' (FIG. 7) of the present invention and profiles 200 and 300 of the prior art (FIGS. 8 and 9), it may be seen that the prior art profiles exhibit an upward, concave deflection across the extent of the base portion referenced at "L." With respect to profiles 300' and 300" of FIGS. 9A and 9B, it may be seen that decreasing the height H of the intermediate portions 308' and 308", such that the profile geometry approaches that of gasket 10' (FIG. 7), concomitantly decreases extent L to a degree that, in gasket 300" of FIG. 9B, the lifting of base portion 306 becomes negligible. Based on these simulations, gasket geometries other that those shown herein now might be envisioned which incorporate the controlled deformation response of the present invention. These other geometries therefore are to be considered to be within the scope thereof.

Regarding gasket profiles 400 (FIG. 10) and 500 (FIGS. 11), however, it may be seen that with lateral member angle θ approaching the boundary conditions of 90° and 0°, respectively, appreciable uplifting of base member 40 begins to develop. Thus, an upper and lower limit for the angular disposition of lateral members 44 relative to that of base member 40 thereby is defined.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A gasket for interposition between a first substrate surface and an oppositely-disposed second substrate surface, said gasket comprising a resilient, tubular body of indefinite length which extends axially along a central longitudinal axis, said tubular body having a generally continuous interior and exterior surface defining a wall thickness of said gasket therebetween and including:

a generally planar base member having an inner surface forming a first portion of the interior surface of said body and an outer surface forming a first portion of the exterior surface of said body for contact with the second substrate surface, said base member extending intermediate a first and a second edge;

a generally arcuate member having an inner surface spaced apart radially from the inner surface of said base member and forming a second portion of the interior surface of said body, and an outer surface forming a second portion of the exterior surface of said body for contact with the first substrate surface, said arcuate member extending radially outwardly from the longitudinal axis along a predetermined locus intermediate a first proximal end disposed radially inwardly of the first edge of said base member, and a second proximal end disposed radially inwardly of the second edge of said base member;

a first lateral member extending from the first edge of said base member to the first proximal end of said arcuate member, said first lateral member having an outer surface forming a third portion of the exterior surface of said body, and an inner surface forming a third portion of the interior surface of said body and defining a first acute angle with the inner surface of said base member; and a second lateral member extending from the second edge of said base member to the second proximal end of said arcuate member, said second lateral member having an outer surface forming a fourth portion of the exterior surface of said body, and an inner surface forming a fourth portion of the interior surface of said body and defining a second acute angle with the inner surface of said base member, whereby said gasket is deflectable under a predetermined compressive force between the first and second substrate surface into a collapsed orientation characterized in that substantially continuous contact is maintained between the outer surface of the base member and the second substrate surface.

2. The gasket of claim 1 wherein said arcuate member is disposed in said collapsed orientation in an abutting, force transferring relationship with said first and said second lateral members urging said base member into contact with the second substrate.

3. The gasket of claim 1 wherein said tubular body has a generally uniform wall thickness.

4. The gasket of claim 1 wherein said first and second acute angle are between about 15° and about 60°.

5. The gasket of claim 1 wherein said first and second angle are substantially equal.

6. The gasket of claim 5 wherein said first and second acute angle are between about 15° and about 60°.

7. The gasket of claim 1 wherein said arcuate member extends along a generally elliptical locus.

8. The gasket of claim 1 wherein said gasket is electrically conductive.

9. The gasket of claim 8 wherein said tubular body is formed of an electrically-conductive material comprising an elastomeric binder component and an electrically-conductive filler component.

10. The gasket of claim 8 further comprising an electrically conductive outer layer disposed on at least a portion of the exterior surface of said gasket.

11. The gasket of claim 10 wherein said outer layer is formed of an electrically-conductive material comprising an elastomeric binder component and an electrically-conductive filler component.

12. The gasket of claim 1 further comprising an adhesive layer for bonding said gasket to the second substrate surface, said adhesive layer having an upper surface disposed on the outer surface of the base member and a lower surface disposable on the second substrate surface, and extending axially generally parallel to said longitudinal axis along at least a portion of the length of said gasket.

13. A gasket for interposition between a first substrate surface and an oppositely-disposed second substrate surface, said gasket comprising a resilient, tubular body of indefinite length which extends axially along a central longitudinal axis, said tubular body having a generally continuous interior and exterior surface defining a wall thickness of said gasket therebetween and including:

a generally planar base member having an inner surface forming a first portion of the interior surface of said body and an outer surface forming a first portion of the exterior surface of said body for contact with the second substrate surface, said base member extending intermediate a first and a second edge;

a generally arcuate member having an inner surface spaced apart radially from the inner surface of said base member and forming a second portion of the interior surface of said body, and an outer surface forming a second portion of the exterior surface of said body for contact with the first substrate surface, said arcuate member extending radially outwardly from the longitudinal axis along a predetermined locus intermediate a first proximal end disposed radially inwardly of the first edge of said base member, and a second proximal end disposed radially inwardly of the second edge of said base member;

a first lateral member extending from the first edge of said base member to the first proximal end of said arcuate member, said first lateral member having an outer surface forming a third portion of the exterior surface of said body, and an inner surface forming a third portion of the interior surface of said body and defining a first acute angle with the inner surface of said base member; and a second lateral member extending from the second edge of said base member to the second proximal end of said arcuate member, said second lateral member having an outer surface forming a fourth portion of the exterior surface of said body, and an inner surface forming a fourth portion of the interior surface of said body and defining a second acute angle with the inner surface of said base member, whereby said gasket is deflectable under a predetermined compressive force between the first and second substrate surface into a collapsed orientation characterized in that substantially continuous contact is maintained between the outer surface of the base member and the second substrate surface, and wherein one or both of the inner surfaces of said arcuate member and said base member are configured as having have an area of enlarged wall thickness defining an elongate bearing member, each said bearing member extending axially generally parallel to said longitudinal axis along at least a portion of the length of said gasket, and extending radially inwardly from a corresponding one of said inner surfaces to a distal end disposable in said collapsed orientation of said gasket in an abutting, force transferring relationship with the other one of said inner surfaces further urging said base member into contact with the second substrate.

14. A gasket deflectable into a collapsed orientation under a predetermined compressive force between a first substrate surface and an opposing second substrate surface, said gasket comprising a resilient, tubular body of indefinite length which extends axially along a central longitudinal axis, said tubular body having a generally continuous interior and exterior surface defining a wall thickness of said gasket therebetween and including:

a generally planar base member having an inner surface forming a first portion of the interior surface of said body and an outer surface forming a first portion of the exterior surface of said body for contact with the second substrate surface, said base member extending intermediate a first and a second edge; and a generally arcuate member having an inner surface spaced apart radially from the inner surface of said base member and forming a second portion of the interior surface of said body, and an outer surface forming a second portion of the exterior surface of said body for contact with the first substrate surface, said arcuate member extending radially outwardly from the longitudinal axis along a predetermined locus intermediate a first proximal end disposed adjacent the first edge of said base member, and a second proximal end disposed adjacent the second edge of said base member, wherein one or both of the inner surfaces of said arcuate member and said base member are configured as having have an area of enlarged wall thickness defining an elongate bearing member, each said bearing member extending axially generally parallel to said longitudinal axis along at least a portion of the length of said gasket, and extending radially inwardly from a corresponding one of said inner surfaces to a distal end disposable in said collapsed orientation of said gasket in an abutting, force transferring relationship with the other one of said inner surfaces urging said base member into contact with the second substrate.

15. The gasket of claim 14 wherein said arcuate member extends along a generally elliptical locus.

16. The gasket of claim 14 wherein said gasket is electrically conductive.

17. The gasket of claim 14 further comprising an adhesive layer for bonding said gasket to the second substrate surface, said adhesive layer having an upper surface disposed on the outer surface of the base member and a lower surface disposable on the second substrate surface, and extending axially generally parallel to said longitudinal axis along at least a portion of the length of said gasket.

18. The gasket of claim 14 wherein the inner surface of said arcuate member is configured as having a first said area of enlarged wall thickness defining a first said bearing member, and wherein the inner surface of said base member is configured as having a second said area of enlarged wall thickness defining a second said bearing member disposed opposite said first bearing member for abutting, force transferring contact therewith in said collapsed orientation of said gasket.

19. The gasket of claim 14 wherein the inner surface of said arcuate member is configured as having one said area of enlarged wall thickness intermediate the first and second proximal ends thereof defining one said bearing member.

20. The gasket of claim 14 wherein the inner surface of said base member is configured as having one said area of enlarged wall thickness intermediate the first and second edges thereof defining one said bearing member.

* * * * *

US006075205C1

(12) EX PARTE REEXAMINATION CERTIFICATE (5589th)
United States Patent
Zhang

(10) Number: US 6,075,205 C1
(45) Certificate Issued: Oct. 31, 2006

(54) TUBULAR EXTRUSION GASKET PROFILE EXHIBITING A CONTROLLED DEFLECTION RESPONSE FOR IMPROVED ENVIRONMENTAL SEALING AND EMI SHIELDING

(75) Inventor: Kai Zhang, Reading, MA (US)

(73) Assignee: Parker Hannifin Customer Support Inc., Irvine, CA (US)

Reexamination Request:
No. 90/006,324, Jul. 9, 2002

Reexamination Certificate for:
Patent No.: 6,075,205
Issued: Jun. 13, 2000
Appl. No.: 09/044,485
Filed: Mar. 19, 1998

Related U.S. Application Data
(60) Provisional application No. 60/065,938, filed on Oct. 27, 1997.

(51) Int. Cl.
*H05K 9/00* (2006.01)

(52) U.S. Cl. .................. 174/35 GC; 277/920
(58) Field of Classification Search ............ 174/35 GC, 174/35 R; 277/920; 439/927; 361/800, 816, 361/818
See application file for complete search history.

(56) References Cited

U.S. PATENT DOCUMENTS 2,736,076 A    2/1956   Bush et al. .................... 20/69

*Primary Examiner*—Dean A. Reichard

(57) ABSTRACT

An EMI shielding and environmental sealing gasket for interposition between a first substrate and an oppositely-disposed second substrate. The gasket is formed of a resilient, tubular body having a generally continuous interior and exterior surface defining a wall thickness of the gasket therebetween, and including base, arcuate, and lateral members. The base member extends intermediate a first and a second edge and has an inner and outer for contact with the second substrate. The arcuate member, which has an inner surface spaced apart radially from the inner surface of the base member and an outer surface for contact with the first substrate, extends intermediate a first proximal end disposed radially inwardly of the first edge of the base member, and a second proximal end disposed radially inwardly of the second edge of the base member. A first lateral member extends from the first edge of the base member to the first proximal end of the arcuate member, with a second lateral member extending from the second edge of the base member to the second proximal end of the arcuate member. Each of the lateral members has an outer surface and an inner surface which defines a acute angle with the inner surface of the base member. The gasket so constructed is deflectable under a predetermined compressive force between the first and second substrates into a collapsed orientation characterized in that substantially continuous contact is maintained between the outer surface of the base member and the second substrate.

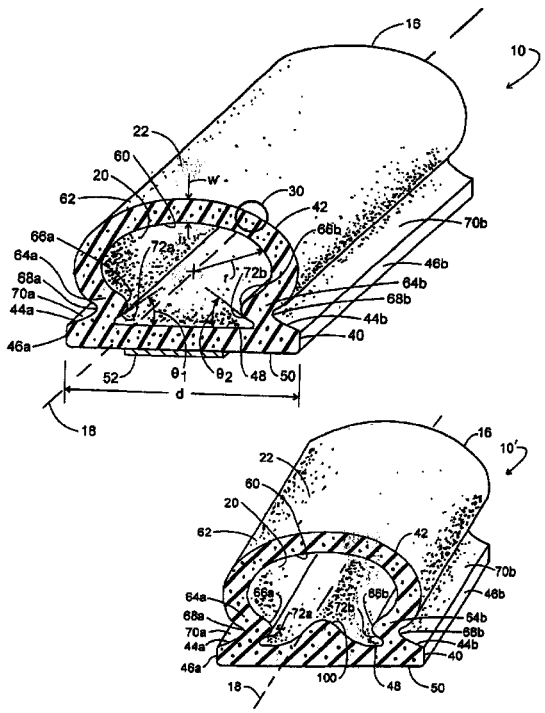

US 6,075,205 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 13–20 is confirmed.

Claim 1 is determined to be patentable as amended.

Claims 2–12, dependent on an amended claim, are determined to be patentable.

New claims 21 and 22 are added and determined to be patentable.

1. A gasket for interposition between a first substrate surface and an oppositely-disposed second substrate surface, said gasket comprising a resilient, tubular body of indefinite length which extends axially along a central longitudinal axis, said tubular body having a generally continuous interior and exterior surface defining a wall thickness of said gasket therebetween and including:
   a generally planar base member having an inner surface forming a first portion of the interior surface of said body and an outer surface forming a first portion of the exterior surface of said body for contact with the second substrate surface, said base member extending intermediate a first and a second edge;
   a generally arcuate member having an inner surface spaced apart radially from the inner surface of said base member and forming a second portion of the interior surface of said body, and an outer surface forming a second portion of the exterior surface of said body for contact with the first substrate surface, said arcuate member extending radially outwardly from the longitudinal axis along a predetermined locus intermediate a first proximal end disposed radially inwardly of the first edge of said base member, and a second proximal end disposed radially inwardly of the second edge of said base member;
   a first lateral member extending from the first edge of said base member to *intersect* the first proximal end of said arcuate member, said first lateral member having an outer surface forming a third portion of the exterior surface of said body, and an inner surface forming a third portion of the interior surface of said body and defining a first acute angle with the inner surface of said base member; and
   a second lateral member extending from the second edge of said base member to *intersect* the second proximal end of said arcuate member, said second lateral member having an outer surface forming a fourth portion of the exterior surface of said body, and an inner surface forming a fourth portion of the interior surface of said body and defining a second acute angle with the inner surface of said base member,
   whereby said gasket is deflectable under a predetermined compresssive force between the first and second substrate surface into a collapsed orientation characterized in that substantially continuous contact is maintained between the outer surface of the base member and the second substrate surface, *and*
   *whereby said arcuate member is disposed in said collapsed orientation with one or both of: (i) the inner surface thereof in an abutting, force transferring relationship with the intersections of the first and second lateral members and the first and second proximal ends of the arcuate member urging said base member into contact with the second substrate; and (ii) the intersections of the first and second lateral members and the first and second proximal ends of said arcuate member being laterally spaced-apart.*

*21. A gasket for interposition between a first substrate surface and oppositely-disposed second substrate surface, said gasket comprising a resilient, tubular body of indefinite length which extends axially along a central longitudinal axis, said tubular body having a generally continuous interior and exterior surface defining a wall thickness of said gasket therebetween and including:*
   *a generally planar base member having an inner surface forming a first portion of the interior surface of said body and an outer surface forming a first portion of the exterior surface of said body for contact with the second substrate surface, said base member extending intermediate a first and a second edge;*
   *a generally arcuate member having an inner surface spaced apart radially from the inner surface of said base member and forming a second portion of the interior surface of said body, and an outer surface forming a second portion of the exterior surface of said body for contact with the first substrate surface, said arcuate member extending radially outwardly from the longitudinal axis along a predetermined locus intermediate a first proximal end disposed radially inwardly of the first edge of said base member, and a second proximal end disposed radially inwardly of the second edge of said base member;*
   *a first lateral member extending from the first edge of said base member to intersect the first proximal end of said arcuate member in defining a first inner radiused portion, said first lateral member having an outer surface forming a third portion of the exterior surface of said body, and an inner surface forming a third portion of the interior surface of said body and defining a first acute angle with the inner surface of said base member; and*
   *a second lateral member extending from the second edge of said base member to intersect the second proximal end of said arcuate member in defining a second inner radiused portion, said second lateral member having an outer surface forming a fourth portion of the exterior surface of said body, and an inner surface forming a fourth portion of the interior surface of said body and defining a second acute angle with the inner surface of said base member,*
   *whereby said gasket is deflectable under a predetermined compressive force between the first and second substrate surface into a collapsed orientation characterized in that substantially continuous contact is maintained between the outer surface of the base member and the second substrate surface, and*
   *whereby said arcuate member is disposed in said collapsed orientation with the inner surface thereof in an* abutting, force transferring relationship with said first and said second inner radiused portions urging said base member into contact with the second substrate.

22. A gasket for interposition between a first substrate surface and an oppositely-disposed second substrate surface, said gasket comprising a resilient, tubular body of indefinite length which extends axially along a central longitudinal axis, said tubular body having a generally continuous interior and exterior surface defining a wall thickness of said gasket therebetween and including:

a generally planar base member having an inner surface forming a first portion of the interior surface of said body and an outer surface forming a first portion of the exterior surface of said body for contact with the second substrate surface, said base member extending intermediate a first and a second edge;

a generally arcuate member having an inner surface spaced apart radially from the inner surface of said base member and forming a second portion of the interior surface of said body, and an outer surface forming a second portion of the exterior surface of said body for contact with the first substrate surface, said arcuate member extending radially outwardly from the longitudinal axis along a predetermined locus intermediate a first proximal end disposed radially inwardly of the first edge of said base member, and a second proximal end disposed radially inwardly of the second edge of said base member;

a first lateral member extending from the first edge of said base member to intersect the first proximal end of said arcuate member in defining a first inner radiused portion, said first lateral member having an outer surface forming a third portion of the exterior surface of said body, and an inner surface forming a third portion of the interior surface of said body and defining a first acute angle with the inner surface of said base member; and a second lateral member extending from the second edge of said base member to intersect the second proximal end of said arcuate member in defining a second inner radiused portion, said second lateral member having an outer surface forming a fourth portion of the exterior surface of said body, and an inner surface forming a fourth portion of the interior surface of said body and defining a second acute angle with the inner surface of said base member, whereby said gasket is deflectable under a predetermined compressive force between the first and second substrate surface into a collapsed orientation characterized in that substantially continuous contact is maintained between the outer surface of the base member and the second substrate surface, and whereby said arcuate member is disposed in said collapsed orientation with the first and said second inner radiused portions being laterally spaced-apart.

* * * * *